Sept. 26, 1961 J. C. MARINACE 3,001,896

DIFFUSION CONTROL IN GERMANIUM

Filed Dec. 24, 1958

INVENTOR
JOHN C. MARINACE

BY *Alvin J. Riddles*
ATTORNEY

United States Patent Office 3,001,896

Patented Sept. 26, 1961

3,001,896

DIFFUSION CONTROL IN GERMANIUM

John C. Marinace, Yorktown Heights, N.Y., assignor to International Business Machines Corporation, New York, N.Y., a corporation of New York Filed Dec. 24, 1958, Ser. No. 782,849
2 Claims. (Cl. 148—1.5)

This invention relates to the controlled introduction of conductivity type determining impurities into a germanium semiconductor body, and in particular, to the control of the surface concentration of the conductivity type determining impurity in the body when the diffusion operation is completed.

As the art of semiconductor device fabrication has advanced, it has developed that in addition to the introduction of conductivity type determining impurities into the semiconductor body, it is necessary for performance reasons in the ultimate device made therefrom, that the quantity of conductivity type determining impurities and the rate of change of this quantity from one region of the semiconductor body to another, are of importance. For example, it has been found in connection with the "drift" transistor known in the art, that it is desirable to have an exponential impurity gradient, wherein the impurity concentration varies from a value which is low in one region to a value which is much higher in another region of the semiconductor body. This provides a "drift" field which enhances minority carrier flow in the semiconductor body. The principal way that has developed in the art to date, to establish such a gradient of resistivity in the semiconductor body, has been by the mechanism of diffusion, in which the conductivity type determining impurity is brought into contact with the semiconductor body at a temperature such that sufficient kinetic energy is given to the atoms of the conductivity type determining impurity and the semiconductor body so that the impurity may penetrate into the semiconductor body. Such penetration has been found to result in a concentration variation of conductivity type determining impurity that is an exponential gradient from a value which is high at the surface to a value which is lower with depth inside the semiconductor body.

However, when this mechanism is employed, a problem is encountered in that, in order to provide diffusion of the conductivity type determining impurity to a sufficient depth inside the body, in a reasonable length of time, the concentration of the conductivity type determining impurity on the surface is generally so great that the electrical performance of contacts made to this surface is adversely affected. There are a number of process steps in the art, for example, etching, that may be performed on such surfaces to reduce the surface concentration of the conductivity type determining impurity and to thereby get better electrical performance of the devices made therefrom. However, any operation on the surface of the body will involve one or more added processing steps.

What has been discovered is a method of controlling the surface concentration of the conductivity type determining impurity in germanium during a diffusion operation so that the surface concentration of the body will be such that fewer process steps will be required to fabricate devices therefrom. This is accomplished by coating the germanium semiconductor body with a germanium oxide coating by heating it in air and subsequently exposing the body to a vapor of the conductivity type determining impurity desired in an oxidizing atmosphere. These steps, when coupled with a later diffusion operation in air, serve to provide a diffused semiconductor body having the desired gradient of resistivity and, at the same time, having a surface concentration that is sufficiently low so as not to adversely interfere with the electrical characteristics of device connections to be made to the surface.

It is an object of this invention to provide a method of diffusing conductivity type determining impurities into germanium semiconductor material.

It is another object of this invention to provide a method of controlling the surface concentration of conductivity type determining impurities in a germanium semiconductor body during diffusion.

It is a related object of this invention to provide methods of controlling the emitter to base breakdown voltage of an alloy-diffused germanium drift transistor.

It is another related object to relax the environmental requirements during a germanium diffusion operation.

Other objects of the invention will be pointed out in the following description and claims and illustrated in the accompanying drawings, which disclose, by way of example, the principle of the invention and the best mode, which has been contemplated, of applying that principle.

Figure 1:
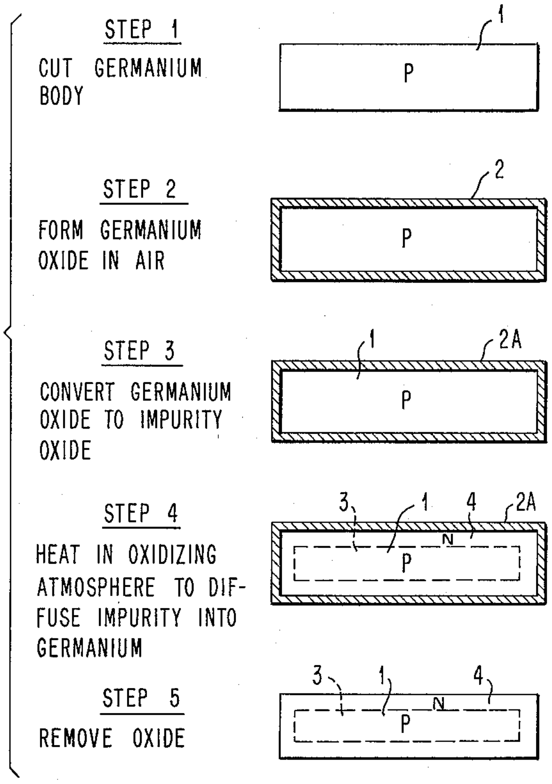
FIGURE 1 is a flow chart illustrating the steps of the process of the invention.

Referring now to FIGURE 1, in step 1, a germanium semiconductor body 1 is cut to size such that when a diffusion operation is performed upon the surfaces thereof, the resulting body will be useable for further device manufacturing practice, either as is, or with subsequent cuttings. As an example of what is meant by the cutting of step 1, a germanium ingot is generally grown in what is known as a "crystal puller" as a large single crystal having a shape which is approximately 1 inch round and about 6 inches long. For purposes of device fabrication, the single crystal ingot is generally oriented with respect to a particular crystallographic plane and longitudinal slabs about 1 inch wide and approximately 0.015 inch thick are cut therefrom, these slabs are then lapped and etched to about 0.005 inch thick. Upon performing a diffusion operation into the major surface of a slab within this size range, which for purposes of illustration may correspond to the large surfaces of the rectangle of FIGURE 1, a number of dice may be cut from the slab upon completion of the diffusion operation, such cuts would be made parallel to the smaller dimension of the rectangle representing the body 1 of step 1 of FIGURE 1.

The second step in connection with the invention is to subject the germanium body 1 to a heating operation in an air atmosphere to form a coating of a germanium oxide 2 over the surface thereof. It has been found, with respect to germanium, that it is essential that the oxide 2 be first formed in an air atmosphere and the diffusion operation conducted in an oxidizing atmosphere in order to provide the diffusion control and advantages to be subsequently described.

The duration of this oxidation operation is related to the time later required for the diffusion of the impurity into the germanium body to the desired depth at the desired concentration so that the oxidation of germanium should be confined to a period sufficiently long to completely coat the germanium but terminated before the coating becomes so thick that an unreasonable length of time is required to accomplish the diffusion operation. A period of seven days at 700° C. is considered to be an unreasonable length of time to accomplish a diffusion operation. It has been found that oxidation for 1 hour at 700° C. provides a satisfactory coating but that 12 hours at 750° C. provides a coating that makes necessary a diffusion operation in excess of seven days.

In step 3 of the invention, the oxidized germanium body is brought into contact with an impurity oxide.

This step is accomplished by exposing the body 1 with the germanium oxide coating 2 on it to a vapor of the conductivity type determining impurity so that a hydrolysis of a halide of the conductivity type determining impurity, may take place on the surface resulting in a coating containing the impurity which has been labelled 2A. For an example, if the conductivity type determining impurity is antimony, this may conveniently done by hydrolizing antimony pentachloride to antimony trioxide on the surface of the wafer 1 for about 1 minute at a temperature of about 100° C. The exact composition of the coating 2A has not definitely been established. It has been established only that exposing the oxidized germanium wafer to a vapor of a conductivity type determining impurity in an oxidizing atmosphere will serve to provide a coating that serves as a source of impurity during diffusion and as a control on the concentration of the impurity. This coating is labelled 2A.

In step 4 the germanium semiconductor body is next subjected to a heating cycle in an oxidizing atmosphere which causes the conductivity type determining impurity to diffuse into the germanium. Since the place of entrance of the conductivity type determining impurity into the germanium body is at the surface, the greater concentration of the impurity will be present there. It is established in the art that the conductivity type of a semiconducor body is determined by the predominance of one conductivity type determining impurity over another, and that the resistivity of a semiconductor body is determined by the net quantity of one conductivity type determining impurity over the other in the body. Thus, it will then be apparent that if the germanium body 1 were to be of P conductivity type as is illustrated and an N conductivity type determining impurity such as for example, antimony, where applied in the form of the coating 2A as previously described, then, the antimony diffusing into the P conductivity type determining impurity, would raise the resistivity thereof by reducing the net quantity of one conductivity type determining impurity over another inside the crystal in the region labelled P, until the net quantity of the P conductivity type determining impurity already in the crystal were overcome by the quantity of the N conductivity type impurity. Where the two types are in balance, a PN junction 3 would occur. Since the N conductivity type determining impurity is introduced from the coating 2A the region labelled N is provided with a gradient of resistivity (the reciprocal of the conductivity) that is the result of progressively lesser quantities of N conductivity type determining impurities being present in the body from the surface adjacent to coating 2A to the interior of the body 1. At the interface between the coating 2A and the germanium body 1, it has been found however, that the concentration of the conductivity type determining impurity is far less than would be the case if the diffusion had taken place into the germanium directly from the environment or if the diffusion were to take place into the germanium directly from an oxide of the impurity without the intermediate oxidation and the establishing of the coating 2A on the germanium body 1, as described in connection with steps 2 and 3.

In step 5 of the process, the coating 2A is removed leaving exposed the germanium semiconductor body, having in the center of the body the original conductivity type, P in this illustration, and having the region 4 adjacent the surface of opposite conductivity type N in this illustration. The impurity distribution in the N region 4 will be such that the resistivity at the surface which has been the interface between the coating 2A and the body 1 will be sufficiently high that rectifying contacts may be made to the surface without having abnormally low reverse breakdown voltages.

The lower surface impurity concentration and hence higher surface resistivity achieved by the diffusion operation of this invention is desirable for many reasons. One of the most frequently encountered reasons in semiconductor device fabrication, is associated with a transistor device performance property known as the emitter-to-base breakdown voltage. One property of rectifying connections to semiconductor devices is the property of avalanche breakdown, which, in one of its effects, determines the amount of back voltage which can be tolerated in the high resistance direction of a PN-junction before an electrical breakdown takes place. It has become established in the art that the magnitude of this electrical breakdown is dependent upon the ratio and abruptness of the change of the resistivities of the semiconductor material on each side of the junction and that, where the resistivity at the surface of the semiconductor material is very low, as occurs in normal diffusion operations, an alloy connection made to such a surface wherein the resistivity is inherently low due to the type of process, will break down in the reverse direction at very small voltages.

In order to aid one skilled in the art in practicing the invention, and to provide a starting place for such practice, the following specific set of dimensions and details for performing the diffusion of the invention is provided, it being understood that no limitation is to be construed from the specifications since it will be apparent to one skilled in the art that a wide range of such sets of specifications may be readily established.

A germanium semiconductor body of P conductivity type having a concentration of indium conductivity type determining impurities therein, such as to provide a resistivity of 6 ohm centimeters was cut into a die approximately 0.5 inch square and having a thickness of approximately 0.005 inch. The body was subjected to a surface oxidation, by placing it in a furnace with an air atmosphere at a temperature of 701° C. for one hour. The wafer was then provided with a film of antimony oxide by hydrolyzing antimony pentachloride by passing $SbCl_5$ vapor over the wafer for about 1 minute, with the wafer at about 100° C. The wafer was next positioned in a large quartz tube which in turn was placed in an air atmosphere furnace at 670° C. for about 120 hours. At the end of this time, the body was removed from the tube and cleaned in hydrofluoric acid and then water. The depth of the junction 3 in FIGURE 1 in the body was measured to be approximately 0.00017 inch and devices made from the body with alloy junctions at the surface were found to have reverse breakdown voltages in the order of 2 to 3 volts.

Figure 2:
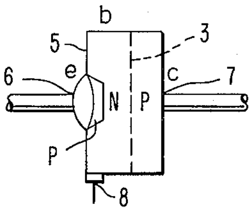
FIGURE 2 is a cross-sectional view of an alloy emitter, diffused base, germanium drift transistor, made employing this invention.

Referring now to FIGURE 2, a view of an alloy emitter graded base germanium drift transistor is shown. The transistor is fabricated in the following manner, a semiconductor body in the condition of step 5 of the process of the invention as illustrated in FIGURE 1 is lapped so that the N region is removed from one face. Then the wafer is cut into disks by an ultrasonic cutter, resulting in each disk having an N layer on only one broad face. The N region on the one face is employed as the base of the transistor labelled *b*, the junction 3 then serves as the collector junction of the device and the original conductivity P region is the collector labelled C. An alloy emitter labelled *e* is provided to the base region *b* by fusing an indium pellet to the surface dissolving some germanium which, upon recrystallizing forms a recrystallized region of P conductivity type labelled P, and, because of the higher resistivity, brought about by the reduced surface impurity concentration of this invention, the region 5, where surrounding the place where the recrystallized region P meets the surface of the semiconductor body is then of a sufficiently high resistivity value that greater reverse breakdown voltages, between the base and the emitter of this device are achieved. An ohmic contact 6, shown as a lean wire is made to the emitter region, and, a similar ohmic lead wire 7 is attached to the collector region. An ohmic base connection 8 is attached to the base region. The above described transistor, made employing as a part of the process, the diffusion operation of this invention, provides all the speed advantages of diffused-base devices and in addition can be brought to cut off with less rigid control in switching applications, in other words, it can stand an appreciable emitter-to-base voltage before breakdown.

What has been described as an improved method of performing a diffusion operation in germanium, wherein the germanium wafer is oxidized and then exposed to a vapor of a conductivity type determining impurity to form a coating on the wafer. With the germanium crystal thus coated, the long temperature cycling associated with diffusion may then be accomplished with a considerable relaxation of the environmental specification and is done in an oxidation type of atmosphere such as room air. The resulting germanium semiconductor body then has a reduced surface concentration of impurities which permits device contacts to be made thereto that are not subjected to the normal limitation of extremely low reverse breakdown voltages such as has characterized devices of this type in the past.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. The method of producing a diffused germanium semiconductor body comprising the steps of forming a germanium oxide coating on a germanium semiconductor body and heating said oxidized body in the presence of a vapor of a conductivity type determining impurity in a closed chamber converting thereby said oxide to an impurity bearing coating on said body, and thereafter, removing said body from said closed chamber and further heating in air for a time and at a temperature to diffuse said conductivity type determining impurity into said body.

2. The method of producing a diffused germanium semiconductor body comprising the steps of forming an oxide coating on a germanium body in an air atmosphere, hydrolyzing $SbCl_5$ in a closed chamber in the presence of said oxidized germanium body forming thereby a coating on said body containing antimony, and thereafter, removing said body from said closed chamber and heating in air for a time and at a temperature sufficient to diffuse said antimony into said germanium body.

References Cited in the file of this patent

UNITED STATES PATENTS

| | | |
|---|---|---|
| 2,802,760 | Derick et al. | Aug. 13, 1957 |
| 2,861,018 | Fuller et al. | Nov. 18, 1958 |
| 2,873,222 | Derick et al. | Feb. 10, 1959 |
| 2,879,190 | Logan et al. | Mar. 24, 1959 |